United States Patent [19]
Lange

[11] Patent Number: 6,046,649
[45] Date of Patent: Apr. 4, 2000

[54] COMMUNICATION SYSTEM EMPLOYING PAIRED POWER AMPLIFIERS AND DRIFT COMPENSATION FEEDBACK CONTROL LOOPS

[75] Inventor: Julius Lange, Cupertino, Calif.

[73] Assignee: Lockheed Martin Corporation, Bethesda, Md.

[21] Appl. No.: 09/200,697

[22] Filed: Nov. 27, 1998

[51] Int. Cl.[7] .............................. H03C 3/00; H04L 27/36
[52] U.S. Cl. ......................... 332/103; 375/297; 375/298; 375/308
[58] Field of Search ................................... 332/103–105; 375/261–265, 279–284, 296, 297, 298, 308

[56] References Cited

U.S. PATENT DOCUMENTS 5,329,259   7/1994   Stengel et al. ........................... 332/103

*Primary Examiner*—David Mis
*Attorney, Agent, or Firm*—Kenneth W. Float

[57] ABSTRACT

A digital communication system having a paired power amplifier circuit with two closely matched parallel paths including paired power amplifiers, and drift compensation feedback control loops that control the phase and amplitude characteristics of the paired parallel paths. The phase and amplitude characteristics of the paired parallel paths are monitored and matched to each other in real time. Outputs of the paired power amplifiers are summed together in a power combiner having difference and the sum ports. A transmit conditioner includes a lookup table receives a digital input and generates phase angles for each of the parallel paths. The drift compensation feedback control loops correlate signals derived from the difference and the sum ports of the power combiner to control the phase and the amplitude of carriers in the two parallel paths. Statistical and dynamic compensation may be employed to implement the phase compensation.

13 Claims, 2 Drawing Sheets

6,046,649

COMMUNICATION SYSTEM EMPLOYING PAIRED POWER AMPLIFIERS AND DRIFT COMPENSATION FEEDBACK CONTROL LOOPS

BACKGROUND

The present invention relates generally to digital communication systems, and more particularly, to a digital communication system employing paired power amplifiers and drift compensation feedback control loops.

In digital communications the quest for ever increasing data rates in a limited bandwidth has led to types of wideband vector modulation of an RF carrier, such as M-ary amplitude-phase shift-key (APK) modulation of an RF carrier, which are very sensitive to distortion.

In its conceptually simplest form the wideband vector modulation would incorporate a pair of very high throughput digital to analog converters, a quadrature modulator and a power amplifier to drive an antenna. Unfortunately microwave high power amplifiers suffer from AM to PM and AM to AM distortion, especially when operated near saturation, where they are most efficient. The effect is especially severe for TWT amplifiers, but all types of amplifiers are affected.

Paired power amplifiers achieve both high efficiency and low distortion by using two amplifiers, which are driven by constant amplitude phase modulated signals. The concept of using paired power amplifiers achieves both high efficiency and low distortion. Two amplifiers are driven by constant amplitude phase modulated signals and the APK vector is formed by signal combining in the RF passband. The control loops, which are the subject of the present invention, are essential to the practical implementation of Paired Power Amplifiers.

For this technique to be effective, there has to be an exact match between the phase and amplitude characteristics of the two signal paths through the amplifiers. For this reason the drift compensation feedback control loops, which are the subject of the present invention, are essential to the practical implementation of paired power amplifiers. Prior art paired amplifier arrangements have not used drift compensation. Prior art paired power amplifiers is disclosed in U.S. Pat. No. 5,329,259 entitled "Efficient Amplitude/Phase Modulation Amplifier", for example.

Therefore, it would be advantageous to have a digital communication system comprising paired power amplifiers that use drift compensation feedback control loops to provide improved operating characteristics.

SUMMARY OF THE INVENTION

The present invention provides for a practical implementation of a digital communication system comprising paired power amplifiers and drift compensation feedback control loops. The phase and amplitude characteristics of two signal paths comprising the paired power amplifiers are monitored and matched to each other in real time. The present invention provides for reliable and efficient operation of the paired power amplifiers within specifications that are maintained over time despite aging and environmental conditions.

More particularly, the digital communication system comprises a paired power amplifier circuit including two closely matched parallel paths that are summed together in a power combiner having difference and the sum ports. A transmit conditioner includes a lookup table for receiving a digital input representing an APK vector that is input to the lookup table to generate phase angles for each of the parallel paths of the paired power amplifier circuit. First and second drift compensation feedback control loops correlate signals derived from the difference and the sum ports of the power combiner to control the phase and the amplitude of carriers in the two parallel paths.

The implementation of the digital communication system employing paired power amplifiers is based on two concepts. Firstly, any constellation point within a radius of 2 R may be generated by adding two vectors of magnitude R. secondly, constant modulus signals may pass through a power amplifier with only minimal distortion. In particular, a signal with no AM incident to a power amplifier will produce neither AM to AM distortion nor AM to PM distortion.

BRIEF DESCRIPTION OF THE DRAWINGS

The various features and advantages of the present invention may be more readily understood with reference to the following detailed description taken in conjunction with the accompanying drawings, wherein like reference numerals designate like structural element, and in which.

DETAILED DESCRIPTION

Figure 1:
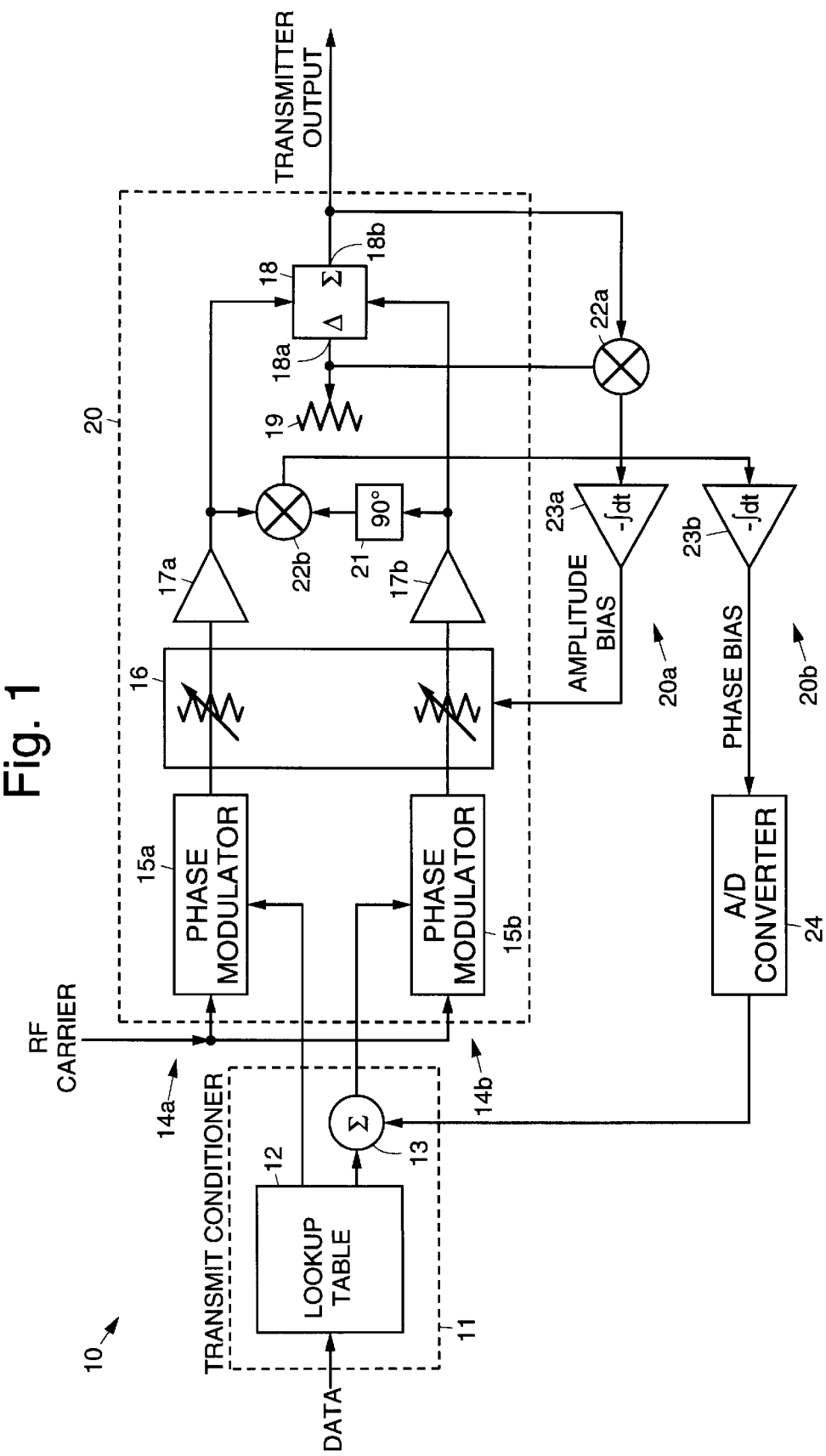
FIG. 1 illustrates a first exemplary embodiment of a digital communication system employing paired power amplifiers in accordance with the principles of the present invention.
Figure 2:
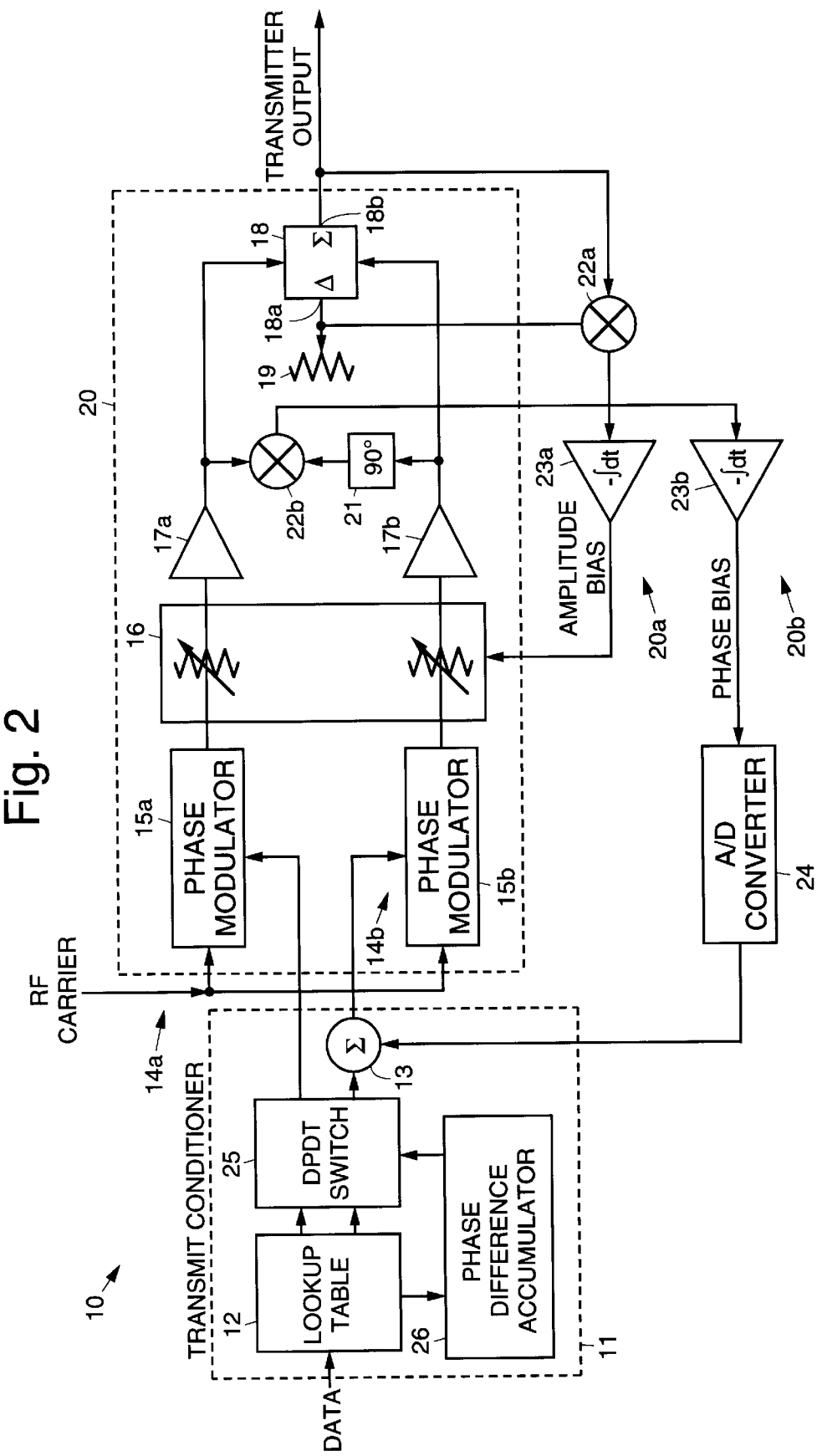
FIG. 2 illustrates a second exemplary embodiment of a digital communication system employing paired power amplifiers of the present invention.

Referring to the drawing figures, FIG. 1 illustrates a first exemplary embodiment of a digital communication system 10 employing paired power amplifiers 17a, 17b in accordance with the principles of the present invention. FIG. 2 illustrates a second exemplary embodiment of a digital communication system 10 employing the paired power amplifiers 17a, 17b. The two digital communication systems 10 are substantially the same except for the addition of a double pole double throw (DPDT) switch 25 and a phase difference accumulator 26 added to the second embodiment.

The structure of the first exemplary embodiment of the digital communication system 10 is shown in FIG. 1. The digital communication system 10 comprises a paired power amplifier circuit 20 that has two closely matched parallel paths 14a, 14b that are summed together in a power combiner 18 at its output. Each path 14a, 14b is comprised of a digital phase modulator 15a, 15b, which feeds a power amplifier 17a, 17b by way of a gain control circuit 16. A digital input (data) representing an APK vector is input to a transmit conditioner 11, which generates required phase angles for the two phase modulators 15a, 15b using a lookup table 12. A first output of the lookup table 12 is coupled to the phase modulator 15a in the first path 14a, while a second output of the lookup table 12 is coupled to a first input of a summing device 13 whose output is coupled to the phase modulator 15b in the second path 14b. A second input of the summing device 13 is derived from a phase control loop 20b.

Since the incident power levels are constant, the power amplifiers 17a, 17b always operate at the same quiescent point. This means that the characteristics of the power amplifiers 17a, 17b are constant from symbol to symbol and the amplifiers 17a, 17b do not contribute any AM to AM or AM to PM distortion signal degradation. Thus the power amplifiers 17a, 17b may be operated at their most efficient bias point.

The two power amplifiers 17a, 17b always produce the maximum power for the link, which corresponds to corner points of the constellation. For other constellation points, excess power is dissipated in a load 19 attached to a difference port (Δ) 18a of the power combiner 18, as is shown in FIG. 1. It is also very important to note that this type of power combiner 18 presents a very good match to both the amplifiers 17a, 17b and an antenna or other load (not shown). Useable implementations of the power combiner 18 include Wilkinson combiners or magic tees, for example. 3 dB quadrature couplers will also operate as the power combiner 18, if the 90° shift is accounted for.

Since the DC input power for most types of microwave power amplifiers 17a, 17b does not depend strongly on the input power level, very little DC power is wasted by operating in this manner. Also waste heat dissipated in the power amplifiers 17a, 17b is less than for other schemes, since part of the waste heat is dissipated in the load 19. This is especially true for TWT amplifiers 17a, 17b.

For the paired power amplifier technique to be effective there has to be an exact match between the phase and amplitude characteristics of the two parallel paths 14a, 14b. For this reason two drift compensation feedback control loops 20a, 20b are needed. An amplitude control loop 20a includes a mixer 22a whose inputs are coupled to the difference (Δ) and sum (Σ) ports 18a, 18b of the power combiner 18. An output of the mixer 22a is coupled by way of an amplitude control loop amplifier 23a to the gain control circuit 16. As shown in FIG. 1, the amplitude control loop 20a utilizes the correlation between the two signals from the difference (Δ) and sum (Σ) ports 18a, 18b of the power combiner 18 to control the amplitude of the carriers in the two parallel paths 14a, 14b.

A phase control loop 20b comprises a mixer 22b coupled to outputs of the power amplifiers 17a, 17b. An output of the mixer 22b is coupled by way of a phase control loop amplifier 23b and an analog to digital converter 24 to the summing device 13. The phase control loop 20b utilizes the correlation between the two output signals from the power amplifiers 17a, 17b to control the phase of the carriers in the two parallel paths 14a, 14b.

The loops 20a, 20b are implemented as low-speed null-seeking servo-control loops. With the exception of the mixers 22a, 22b only low frequency components are used. The details of the implementation and the underlying theory are given below.

The amplitude control loop 20a utilizes the fact that the sum and the difference of two vectors of equal length are in quadrature. Thus, as shown in FIG. 1, the signals from the difference and the sum ports 18a, 18b of the power combiner 18 are sent to a mixer 22a, the output of which is zero, if they are in quadrature, indicating that the two vectors are indeed of equal length. If the amplitudes of the carriers in the two parallel paths 14a, 14b are not equal the output of the mixer 22a generates an amplitude bias voltage, which drives the amplitude compensation loop 20a. It should be emphasized that this quadrature relationship exists for each and every symbol transmitted so that the amplitude control loop 20a does not depend on statistical averaging, in contrast to the phase control loop 20b described below.

The phase control loop 20b utilizes the fact that the product of two vectors is proportional to the cosine of the included angle. Therefore the output signals from the power amplifiers 17a, 17b are sent to another mixer 22b, which includes a 90° phase shift. Thus the output voltage of that mixer 22b is proportional to the sine of the phase difference between the two paths 14a, 14b and the polarity of the voltage depends on, which signal leads the other. If the long time average of the phase differences is zero, the output of the mixer 22b can be used to drive the phase control loop 20b.

Any desired output can be achieved in two ways with either one or the other signal leading. Thus, modulation schemes may be devised, which match positive phase differences with negative ones to produce a long term average of zero. Two specific methods are discussed below.

A statistical method is implemented in the system 10 shown in FIG. 1. In FIG. 1 the phase differences for the constellation points are chosen to make the sum over all the points equal to zero. Thus, if all points are equally likely, the long time average is zero. This method has been successfully used for other types of adaptive loops in data receivers.

A dynamic method is implemented in the system 10 shown in FIG. 2. In FIG. 2 the double pole double throw (DPDT) switch 25 is disposed between the lookup table 12 and inputs of the phase modulators 15a, 15b. The lookup table 12 is arranged such that, for a straight through position of the switch 25, the phase difference is positive for all constellation points. Then, for the other position of the switch 25, the phase difference is always negative. The switch 25 in turn is driven by the phase difference accumulator 26, which keeps track of the sum of all the phase angles. Whenever the sum is positive, the angle of the next symbol is made negative and vice-versa. Thus, the magnitude of the accumulated sum is always less than 180° and the long time average is very close to zero.

The concept of using paired power amplifiers 14a, 14b implemented by the present invention has the following advantages. The paired power amplifier implementation has high efficiency and low distortion. The paired power amplifier implementation uses a simple look-up table 12 based on trigonometric identities, and no detailed knowledge of the characteristics of the paired power amplifiers 17a, 17b is required.

The drift compensation feedback control loops 20a, 20b are implemented as low speed null-seeking servo-control loops. With the exception of the mixers 22a, 22b, only low frequency components are used. Waste heat dissipated in the power amplifiers 17a, 17b is less than for other schemes of equal high efficiency, since part of the waste heat is dissipated in the load 19.

Analysis of the paired power amplifier technique of the present invention indicates that it can generate high power QAM signals of high order, such as 64 QAM, 32 QAM or 12-4 QAM, with maximum power amplifier power efficiency and only minor distortion.

Thus, digital communication systems comprising paired power amplifiers that use drift compensation feedback control loops to provide improved operating characteristics have been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A digital communication system, comprising:
   a paired power amplifier circuit comprising two closely matched parallel paths that are summed together in a power combiner having difference and the sum ports;
   a transmit conditioner comprising a lookup table for receiving a digital input that is input to the lookup table to generate phase angles for the parallel paths of the paired power amplifier circuit; and first and second drift compensation feedback control loops that correlate signals derived from the difference and the sum ports of the power combiner to control the phase and the amplitude of carriers in the two parallel paths.

2. The system recited in claim 1 wherein the parallel paths each comprise a digital phase modulator, coupled to a power amplifier by way of a gain control circuit.

3. The system recited in claim 2 wherein the lookup table generates phase angles for the digital phase modulators.

4. The system recited in claim 1 wherein the power amplifiers operate at the same quiescent point.

5. The system recited in claim 1 wherein the power combiner comprises a Wilkinson combiner.

6. The system recited in claim 1 wherein the power combiner comprises a magic tee.

7. The system recited in claim 1 wherein the power combiner comprises a 3 dB quadrature coupler.

8. The system recited in claim 2 wherein:

the first drift compensation feedback control loop comprises an amplitude control loop including a mixer having inputs are coupled to the difference and sum ports of the power combiner and an output coupled by way of an amplifier to the gain control circuit; and the second drift compensation feedback control loop comprises a phase compensation loop including a mixer coupled to outputs of the power amplifiers and having an output coupled by way of an amplifier and an analog to digital converter 24 to a summing device coupled to an output of the lookup table.

9. The system recited in claim 8 wherein the amplitude control loop uses a correlation between signals from the difference and sum ports of the power combiner to control the amplitude of the carriers in the two parallel paths, and the phase control loop uses a correlation between the output signals from the power amplifiers to control the phase of the carriers in the two parallel paths.

10. The system recited in claim 1 which implements a statistical method wherein phase differences for constellation points are chosen to make the sum over all the points equal to zero.

11. The system recited in claim 2 further comprising:

a double pole double throw switch is coupled between the lookup table and inputs of the phase modulators; and a phase difference accumulator coupled to the lookup table and the double pole double throw switch.

12. The system recited in claim 11 which implements a dynamic method wherein the lookup table is arranged so that, for a straight through position of the switch, the phase difference is positive for all constellation points, and for the other position of the switch, the phase difference is always negative and wherein the switch is driven by the phase difference accumulator which keeps track of the sum of all the phase angles, such that whenever the sum is positive, the angle of the next symbol is made negative and vice-versa.

13. The system recited in claim 1 wherein the digital input represents an APK vector.

* * * * *